US00RE36210E

United States Patent [19]

Santin

[11] E Patent Number: Re. 36,210

[45] Reissued Date of Patent: May 11, 1999

[54] CIRCUIT AND METHOD FOR ERASING EEPROM MEMORY ARRAYS TO PREVENT OVER-ERASED CELLS

[75] Inventor: Giovanni Santin, Rieti, Italy

[73] Assignee: Texas Instruments Incorporated, Dallas, Tex.

[21] Appl. No.: 08/259,941

[22] Filed: Jun. 15, 1994

Related U.S. Patent Documents

Reissue of:

[64] Patent No.: 5,122,985
Issued: Jun. 16, 1992
Appl. No.: 07/509,432
Filed: Apr. 16, 1990

[51] Int. Cl.[6] ..... G11C 16/04

[52] U.S. Cl. ..... 365/185.19; 365/185.29; 365/185.3

[58] Field of Search ..... 365/104, 184, 365/185, 218, 185.29, 185.3; 257/314, 315

[56] References Cited

U.S. PATENT DOCUMENTS

| | | | |
|---|---|---|---|
| 3,728,695 | 4/1973 | Frohman-Bentchkowsky | 340/173 R |
| 3,744,036 | 7/1973 | Frohman-Bentchkowsky | 340/173 R |
| 3,938,108 | 2/1976 | Salsbury et al. | 340/173 R |
| 4,181,980 | 1/1980 | McCoy | 365/45 |
| 4,209,849 | 6/1980 | Schrenk | 365/182 |
| 4,247,918 | 1/1981 | Iwahashi et al. | 365/218 |
| 4,266,283 | 5/1981 | Perlegos et al. | 365/104 |
| 4,334,292 | 6/1982 | Kotecha | 365/182 |
| 4,357,685 | 11/1982 | Daniele et al. | 365/189 |
| 4,377,857 | 3/1983 | Tickle | 365/185 |
| 4,397,000 | 8/1983 | Nagami | 365/189 |
| 4,400,799 | 8/1983 | Gudger | 365/95 |
| 4,404,577 | 9/1983 | Cranford, Jr. et al. | 357/23 |
| 4,434,478 | 2/1984 | Cook et al. | 365/185 |
| 4,435,790 | 3/1984 | Tickle et al. | 365/218 |
| 4,460,982 | 7/1984 | Gee et al. | 365/189 |
| 4,689,787 | 8/1987 | Hotta | 370/104 |
| 4,766,473 | 8/1988 | Kuo | 357/23.5 |
| 4,779,272 | 10/1988 | Kohda et al. | 371/21 |
| 4,783,766 | 11/1988 | Samachisa et al. | 365/185 |
| 4,792,925 | 12/1988 | Corda et al. | 365/185 |
| 4,807,003 | 2/1989 | Mohammadi et al. | 357/23.5 |
| 4,858,194 | 8/1989 | Terada et al. | 365/203 |
| 4,860,261 | 8/1989 | Kreifels et al. | 365/218 |
| 4,875,188 | 10/1989 | Jungroth | 365/185 |
| 4,888,734 | 12/1989 | Lee et al. | 365/185 |
| 4,903,236 | 2/1990 | Nakayama et al. | 365/185 |
| 4,939,690 | 7/1990 | Momodomi et al. | 365/185 |
| 4,958,317 | 9/1990 | Terada et al. | 365/185 X |
| 4,958,321 | 9/1990 | Chang | 365/185 |
| 4,959,812 | 9/1990 | Momodomi et al. | 365/185 |
| 4,996,571 | 2/1991 | Kume et al. | 357/23.5 |
| 5,022,001 | 6/1991 | Kowalski et al. | 365/185 |
| 5,043,940 | 8/1991 | Harai | 365/168 |
| 5,047,981 | 9/1991 | Gill et al. | 365/185 |
| 5,060,195 | 10/1991 | Gill et al. | 365/185 |
| 5,065,364 | 11/1991 | Atwood et al. | 365/185 |
| 5,177,705 | 1/1993 | McElroy et al. | 365/185 |
| 5,293,560 | 3/1994 | Harari | 365/185 |

*Primary Examiner*—Joseph A. Popek
*Assistant Examiner*—Hoai V. Ho
*Attorney, Agent, or Firm*—Robby T. Holland; Carlton H. Hoel; Richard L. Donaldson

[57] ABSTRACT

The device and process of this invention provide for eliminating reading errors caused by over-erased cells by applying flash erasing pulses, then flash programming pulses to the cells of an EEPROM array. The flash erasing pulses are sufficient in strength to over-erase the cells. The flash programming pulses applied to the control gates have the same voltages as those used to program individual cells. The strength of the programming electric field pulses adjacent the floating gates is controlled by applying a biasing voltage to one of the source/drain regions of the cells. The biasing voltage controls the energy level of the programming field pulses such that only enough charge is transferred to the floating gates to cause the threshold voltages of the cells to have positive values less than that of a predetermined wordline select voltage.

32 Claims, 2 Drawing Sheets

CIRCUIT AND METHOD FOR ERASING EEPROM MEMORY ARRAYS TO PREVENT OVER-ERASED CELLS

Matter enclosed in heavy brackets [ ] appears in the original patent but forms no part of this reissue specification; matter printed in italics indicates the additions made by reissue.

BACKGROUND OF THE INVENTION

This invention relates to nonvolatile memory arrays, such as electrically-erasable, electrically-programmable, read-only-memories (EEPROMS) of the single-transistor type and to eliminating errors that occur in reading EEPROM cell arrays having over-erased cells.

In particular, the invention relates to avoiding or eliminating read errors resulting from over-erasing the floating-gate conductors of nonvolatile memory arrays. An EEPROM cell is over-erased when an excessive number of electrons is removed from its floating gate during an erasing operation. The source-drain path of an over-erased EEPROM cell is conductive with the control gate and the source or drain at the same electric potential.

EEPROM arrays include floating-gate memory cells arranged in rows and columns. The floating gate of a programmed memory cell is charged with electrons, and the electrons in turn render the source-drain path under the charged floating gate nonconductive when a chosen wordline select voltage is applied to the control gate. The nonconductive state is read as a "zero" bit. The floating gate of a non-programmed cell is positively charged, is neutrally charged, or is slightly negatively charged, such that the source-drain path under the non-programmed floating gate is conductive when the same chosen wordline select voltage is applied to the control gate. The conductive state is read as a "one" bit.

Each column and row of an EEPROM array may contain thousands of cells. The sources of each cell in a column are connected to a bitline (source-column line). The drains of each cell in a column are connected to a separate bitline (drain-column line). The control gates of each cell in a row are connected to a wordline. Prior to first programming, or perhaps after erasure by ultraviolet light, the source-drain paths of the cells begin to conduct at a uniform control-gate threshold voltage Vt because the floating gates are neutrally charged (having neither an excess of electrons nor a deficiency of electrons). The initial uniform threshold voltage Vt may be, for example, +2.5 volts between control gate and source. The initial uniform threshold voltage Vt may be adjusted by appropriately doping the channel regions of the cells during manufacture.

After programming, the source-drain paths of the programmed cells have control-gate threshold voltages Vt distributed over a range between +6 volts to +9 volts, for example. The distribution of threshold voltages Vt among individual cells is caused by processing variations, including variations in the tunnel oxide thicknesses, the areas of tunneling regions and in the coupling ratios of the control-gate voltages to the floating gates, as well as variations in the programming voltages applied to individual cells.

After electrical erasure of the cells, the threshold voltages Vt of the erased cells may, for example, be distributed over a range from perhaps +0.5 to 2.5 volts with the majority of the cells having erased threshold voltages Vt near +1.5 volts, the range depending on the localized variations in the tunnel oxide thickness, the areas of tunneling regions, the capacitive coupling ratios between wordlines and floating gates, and the strengths of the erasing pulses. Using a lower-strength erasing pulses, the range may be from perhaps +1.5 to +3.5 volts with the majority of the cells having erased threshold voltages Vt near 2.5 volts. With higher-strength erasing pulses applied, the distribution may range from perhaps −0.5 to +1.5 volts with the majority of cells having erased threshold voltages Vt near +0.5 volt. Cells with erased threshold voltages Vt less than that set during the manufacturing process have deficiencies of electrons (or have net positive charges) on the floating gates. The excess of positive charges on the floating gates causes the channel regions under such gates to be enhanced with electrons.

In general, the extent of channel doping, the programming pulse strength, the erasing pulse strength and other factors are chosen such that the source-drain path of a cell will either be conductive or non-conductive when applying a chosen wordline select voltage to the control gate. The select voltage must have a value somewhere between the highest erased-threshold-voltage value of erased cells and the lowest programmed-threshold-voltage value of the programmed cells. In many memory arrays, the channel doping, programming/erasing voltages and other factors are chosen such that the wordline select voltage is equal to the available chip supply voltage Vcc, which may be +5 volts. With +5 volt applied to the control gate, the source-drain paths of all of the properly erased cells are conductive only if those cells have threshold voltages Vt below the +5 volt select voltage. Similarly, the source-drain paths of all of the properly programmed cells are non-conductive only if those cells have threshold voltages Vt greater than the +5 volt select voltage. To guarantee that the correct state of a cell is sensed with a reasonable speed, even with a noisy chip supply voltage Vcc and with other typical fluctuations in drain bitline voltage, all of the threshold voltages Vt of erased cells should be considerably less than +5 volts, perhaps less than +3.5 volts, and all of the threshold voltages Vt of programmed cells should be considerably greater than +5 volts, perhaps greater than +6.0 volts.

One of the problems associated with EEPROMs of the type without split gates is the difficulty of reading memory arrays after some of the cells have been over-erased, becoming depletion-mode devices. Because the channel regions of the over-erased cells are in connected in parallel with all of the source-drain paths of other cells in a column, inaccuracies during reading operation may occur where the stored data in those columns is short-circuited by the over-erased cells. At least some of the over-erased cells may be conductive because the excessive positive charge on the floating gates causes the channel regions to invert from P-type to N-type.

The problems of over-erasure may be avoided by constructing cells with pass gates, or split gates, in which the channel between source and drain comprises two series sections, one section having the control gate separated from the channel region by the gate dielectric, the second region having the floating gate separated from the channel region by the gate dielectric. However, such memory cells require more area on a silicon chip than do cells without split gates.

The problem of over-erasure may also be minimized by performing multiple erasing operations, each operation increasing the erasing energy applied to the floating gate. Between each operation, the threshold voltages Vt of all of the cells may be checked to see that a given maximum threshold voltage Vt is not exceeded. However, that procedure does not provide correction for any cells that may be over-erased.

Alternatively, a similar procedure may be used to check between increased-energy erasing pulses to determine that the minimum erased threshold voltage Vt does not become less than some value greater than zero. However, this does not always guarantee that the highest erased threshold voltage Vt is low enough and, therefore, some of the cells may remain programmed. The highest erased threshold voltage Vt will determine the speed at which the memory will operate.

The circuit and method of U.S. Patent Application Ser. No. 07/367,597, filed June 19, 1989, and also assigned to Texas Instruments Incorporated, relate to normal erasure of the cells of a memory array followed by application of relatively low-energy pre-conditioning pulses to the cells prior to reprogramming the array. The low-energy pulses may tend to program and/or erase the cells, depending on the which is needed to distribute the threshold voltages between 0 volts and the select wordline voltage. The circuit and method of U.S. Patent Application Ser. No. 07/509,532, filed Apr. 16, 1990 and also assigned to Texas Instruments Incorporated, relate to erasure of the cells of a memory array through alternate application of relatively high-energy programming and erasing pulses, followed by alternate application of alternate programming and erasing pulses with decreasing energy levels.

In the alternative, the negative-voltage method of U.S. Patent Application Ser. No. 07/437,553, filed Nov. 17, 1989 and also assigned to Texas Instruments Incorporated may be used to eliminate the adverse effects of over-erasure of memory cells. However, use of a negative voltage applied to wordlines requires special driver circuitry.

As yet another alternative for eliminating over-erasure errors, the channel regions of the EEPROM cells may have increased doping and the read voltages may be increased as described in U.S. Patent Application Ser. No. 07/437,553, filed Nov. 16, 1989 and also assigned to Texas Instruments Incorporated.

There is a need for an alternative circuit and procedure that permit an EEPROM array to be read without the need for special driver circuitry, while at the same time permitting minimum-size memory cells without split gates. The circuit and procedure should eliminate errors caused by cells with excessively high or low threshold voltages Vt caused by conventional erasing methods.

SUMMARY OF THE INVENTION

The circuit and process of this invention provide for eliminating reading errors caused by over-erased cells by applying flash-erasing pulses between the control gates and the source/drain regions of all of the cells of an EEPROM array, the flash-erasing pulses having sufficient energy to cause all of the cells of the array to be over-erased. Subsequently, flash-programming pulses are applied between the control gates and biased source/drain regions of all of the cells, the flash-programming pulses applied to the control gates have the same energy level as programming pulses used to program individual cells. However, the source/drain regions of the cells are biased at a voltage level that limits the charge transfer to the floating gates of the cells such that, after the flash-programming operation, the cells have a range of positive threshold voltages Vt below the select voltage used for read operations.

The circuit and process of this invention do not require that the threshold voltages Vt of the cells be monitored during the erase sequence of erase/program operations.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1:
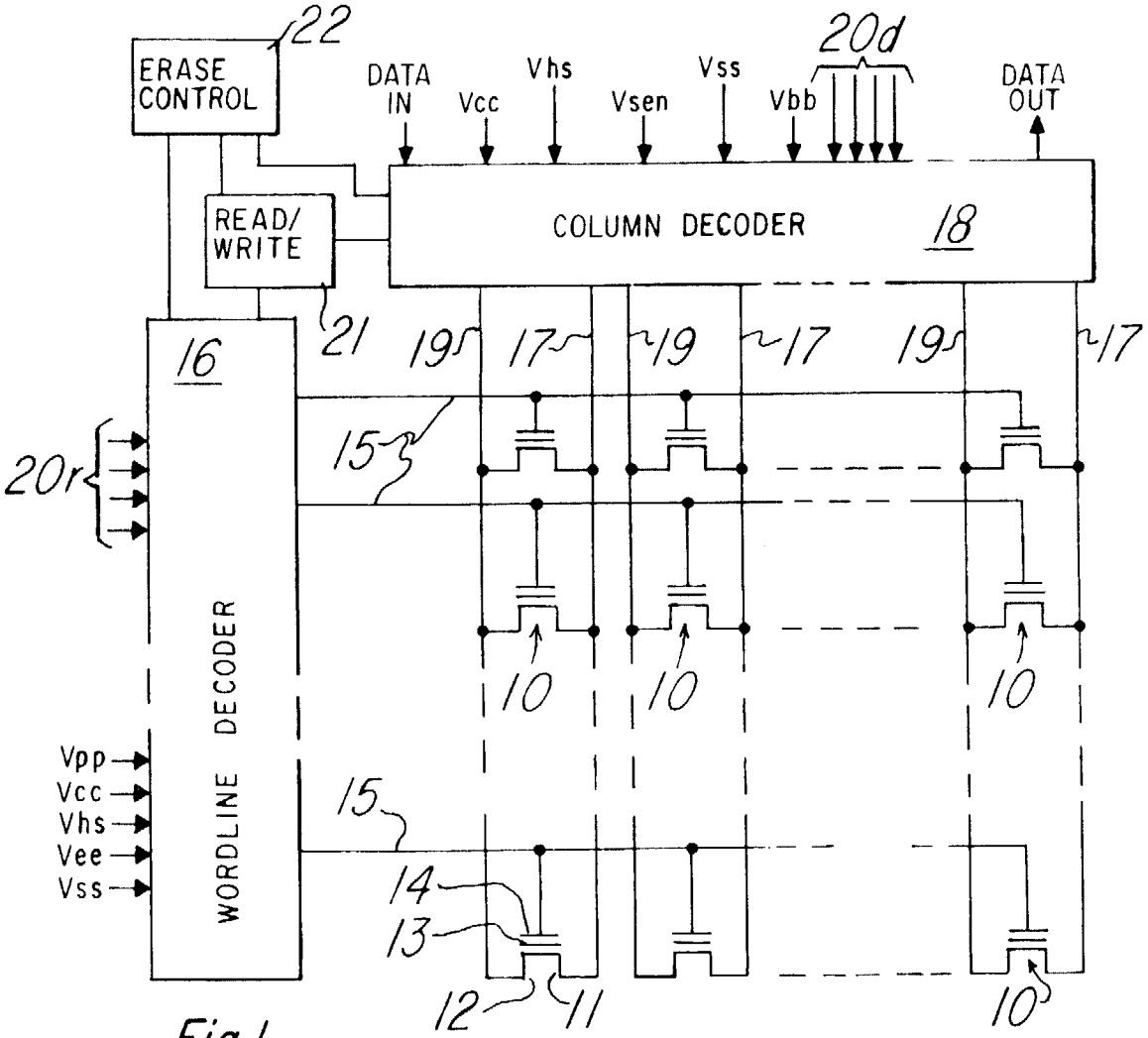
FIG. 1 is a representation of an array of memory cells and associated circuitry according to this invention.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13 and a control gate 14. A control terminal of each of the control gates 14 in a row of cells 10 is connected to a wordline 15, and each of the wordlines 15 is connected to a wordline decoder 16. A source terminal of each of the sources 11 in a column of cells 10 is connected to a source-column line 17, and each of the source-column lines 17 is connected lo a column decoder 18. A drain terminal of each of the drains 12 in a column of cells 10 is connected to a drain-column line 19, and each of the drain-column lines 19 is connected to the column decoder 18.

In a write or program mode, the wordline decoder 16 may function, in response to wordline address signals on lines 20r and to a signal from read/write control circuit 21, to place a preselected first programming voltage Vpp (approx. +16 to +18 volts) on a selected wordline 15, including a selected control gate conductor 14. Column decoder 18, in response to signals on lines 20d and to a signal from read/write control circuit 21, may function to place a preselected second programming voltage (reference potential Vss or ground, or a non-positive voltage) on selected source-column line 17, which includes a selected source 11 region. The preselected second programming voltage Vss must differ sufficiently from the first preselected programming voltage Vpp that excess electrons will migrate, perhaps by Fowler-Nordheim tunneling, to the selected floating-gate conductor 13 and, as a result, program that selected floating-gate conductor 13. Column decoder 18 may optionally, in response to signals on lines 20d and to a signal from read/write control 21, place a third preselected voltage Vhs (approx. +7 volts above Vss) on deselected source-column lines 17, including deselected source 11 regions within the array, to prevent a disturb of programmed floating-gate conductors associated with the deselected source 11 regions. The wordline decoder 16 may optionally, in response to wordline address signals on lines 20r and to a signal from read/write control 21, place a fourth preselected voltage, which may also be Vhs (approx. +7 volts), on deselected wordlines 15, including deselected control-gate conductors 14. The fourth preselected voltage should be sufficiently close to the second programming voltage that the floating-gate conductors 13 associated with the deselected wordlines 15 will not be programmed as a result, but should be sufficiently high that stress will be reduced across any tunneling windows of cells 10 in deselected wordlines 15, thereby avoiding de-programming of pre-programmed cells 10. The third and fourth preselected voltages should be placed on the respective electrodes before both first and second preselected programming voltages Vpp and Vss are both placed on their respective electrodes. The first programming voltage Vpp may be placed on the control-gate conductors 14 in a gradual manner so as to reduce voltage-induced stress on the selected cell 10. The drain-column lines 19 may be left floating. The floating gate 13 of the selected cell 10 is charged with electrons during programming, and the electrons in turn render the source-drain path under the floating gate 13 of the selected cell 10 non-conductive, a state which is read as a "zero" bit. Deselected cells 10 have source-drain paths under the floating gate 13 that remain conductive, and those cells 10 are read as "one" bits.

During a prior-art-type flash-erase mode, the column decoder 18 functions to apply a positive voltage Vcc (approx. +5 volts) to all the source-column lines 17. The column decoder 18 functions to leave all drain-column lines 19 floating. The wordline decoder 16 functions to apply a high negative voltage Vee (approx. −11 volts) to all the wordlines 15. The excess electrons are removed from the floating gates 13 of programmed cells 10. Selective erasing may be accomplished by changing Vee to perhaps −5 volts and by applying voltage Vcc to the selected wordline 15 while perhaps +10 volts is applied to the deselected wordlines 15 and the selected source-column line 17. Ground or reference voltage Vss is applied to the deselected source-column lines 17. Other applied voltages are the same as those of the flash-erase example.

In the read mode, the wordline decoder 16 functions, in response to wordline address signals on lines 20r and to a signal from read/write control circuit 21, to apply a preselected positive voltage Vcc (approx. +3 to +5 volts) to the selected wordline 15 (and the selected control gate 14), and to apply a low voltage (ground or Vss) to deselected wordlines 15. The column decoder 18 functions, in response to column address signals on lines 20d, to apply a preselected positive voltage Vsen (approx. +1 to +1.5 volts) to the selected drain-column line 19. The column decoder 18 also functions to connect all source-column lines 17 to ground (or Vss). The conductive or nonconductive state of the cell 10 connected to the selected drain-column line 19 and the selected wordline 15 is detected by a sense amplifier (not shown) connected to the DATA OUT terminal.

As is well-known, the source 11 regions and the drain 12 regions of the memory cells 10 may be interchanged for the various modes of operation. For example, Fowler-Nordheim tunneling for programming and/or erasing may take place between a drain 12 region and a floating-gate conductor 13, or between a source 11 region and a floating-gate conductor 13. Voltages applied to the source 11 and drain 12 regions in the read example above are interchangeable. Therefore, the terms "source" and "drain" as used herein are considered interchangeable for each mode of operation.

For convenience, a table of read, write and prior-art erase voltages is given in the TABLE I below:

TABLE I

| | | | Erase | |
|---|---|---|---|---|
| | Read | Write | Selected | Flash |
| Selected Wordline | 3–5 V | 16–18 V | −5 V | −11 V |
| Deselected Wordlines | 0 V | 7 V | 10 V | (None) |
| Selected Source Line | 0 V | 0 V | 10 V | 5 V |
| Deselected Source Lines | Float | 7 V | 0 V | (None) |
| Drain Lines | 1–1.5 V | Float | Float | Float |

The cells 10 of FIG. 1 are presumed to be of the type that does not include a split gate, or a pass gate. The cells 10 of FIG. 1 are shown connected with separate source-column lines 17 for each column of sources 11 and with separate drain-column lines 19 for each column of drains 12, although this invention applies equally to cells 10 that are arranged in columns having common bitlines 17 and/or 19.

The source-drain paths of each cell 10 in a column are connected in parallel. Because of the parallel connection, a conductive cell 10 in a column will short-circuit all of the other cells 10 in that column. In particular, if one of the cells 10 in a column is sufficiently over-erased, the channel region of that cell 10 will be inverted from P-type to N-type material by positive charges on floating gate 13, and the source-drain path of cell 10 will be conductive. A column of cells 10 that is short-circuited by one or more over-erased cells 10 is difficult, perhaps impossible, to read if the cell 10 is constructed without a pass gate.

Application of pulsed programming voltages or currents to selected cells 10 causes pulsed programming electric fields in the insulated region between the floating gate 13 and the substrate of the selected memory cells 10 of the EEPROM array, the electric fields being adjacent at least an area of floating gate 13 and being directed away from that area of each of the floating gates 13. As illustrated by curve A of FIG. 2(a), the cells 10 of an array have, in general, a fairly uniform initial threshold voltage Vts prior to programming of those cells 10. The initial threshold voltage Vts is set during manufacture by doping the channel region of the cell 10 with an impurity of conductivity-type (P-type or N-type), usually opposite that used to dope the source 11 and drain 12 regions. The initial threshold voltage Vts in floating-gate-type memory cells 10 is usually in the range of one half of the wordline-select voltage Vcc applied to the control gate during read operations. The wordline select voltage Vcc is often the chip supply voltage. For example, initial threshold voltages Vt of available cells 10 may range from +1.5 to +3.5 volts where Vcc is 5 volts.

Figure 2A:
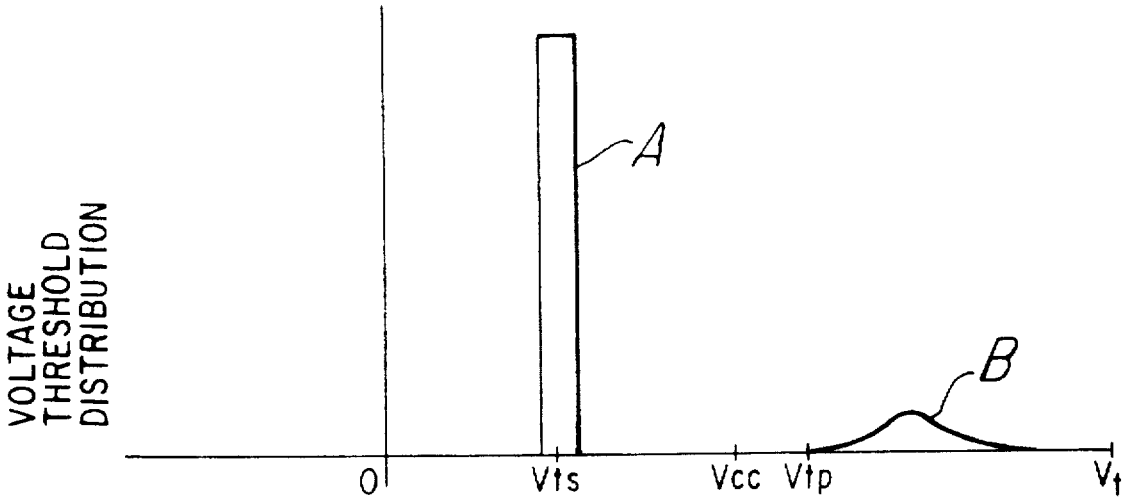
FIG. 2(a) illustrates an example distribution of threshold voltages of an array of memory cells after manufacture or after ultraviolet-type of erasure and before programming and illustrates an example distribution of threshold voltages after programming.

After application of pulsed programming voltages/currents, as illustrated by curve B of FIG. 2(a), selected cells 10 have distributed threshold voltages Vt above a minimum programmed-threshold voltage Vtp, the distribution being caused by random processing variations. The value of Vtp in may be, for example, one volt above wordline select voltage Vcc (one volt above the supply voltage). Some of the cells 10 may have localized thinner dielectrics, perhaps resulting from a process that is location-dependent. Other cells 10 may have smaller-area channel regions, perhaps because of variations in masking size. The programmed threshold voltage Vt distribution B is illustrated as a Gaussian or bell-shaped distribution in FIG. 2(a), although actual distributions have a variety of shapes depending on particular types of processing variations.

Figure 2B:
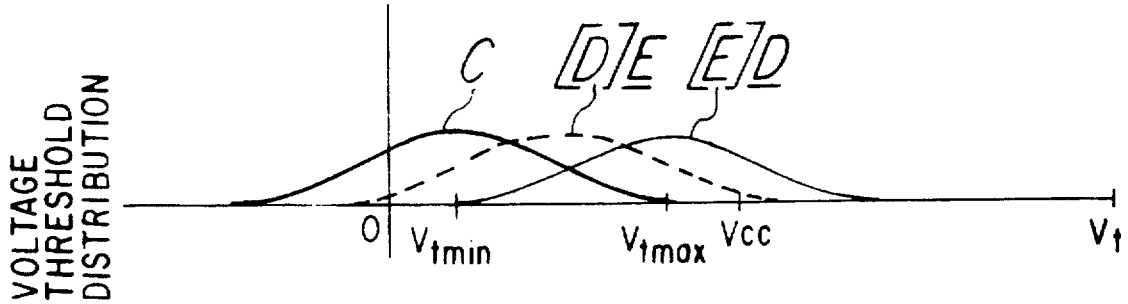
FIG. 2(b) illustrates example distributions of threshold voltages of the array of memory cells after erasure.

Curve C of FIG. 2(b) illustrates an erased threshold voltage Vt distribution in which, according to known procedures, the cells 10 are tested between application of pulsed erasing voltages/currents of different energy levels until all of the cells 10 have threshold voltages Vt below a prescribed maximum threshold voltage Vtmax, which is less than the select voltage Vcc. As illustrated by the negative threshold voltages Vt of Curve C, a disadvantage of the known method is that some of the cells 10 may be over-erased in order to achieve the maximum threshold voltage limitation, Vtmax. Those over-erased cells 10 will short-circuit the connected source-column and drain-column lines 17 and 19, causing erroneous reading of the programmed cells 10 sharing the columns in which over-erased cells 10 are located.

Curve D of FIG. 2(b) illustrates a type of erased threshold voltage Vt distribution in which cells 10 are tested between application of pulsed erasing voltages/currents of different energy levels until all of the cells 10 have threshold voltages Vt above a prescribed minimum threshold voltage Vtmin. As illustrated by Curve D, a disadvantage of this method is that some of the cells 10 may have threshold voltages Vt that exceed the select voltage Vcc. Those cells 10 will be read as programmed cells.

Curve E of FIG. 2(b) illustrates an extreme type of erased threshold voltage Vt distribution in which some of the cells 10 are over-erased and in which some of the cells 10 remain programmed.

Figure 2C:
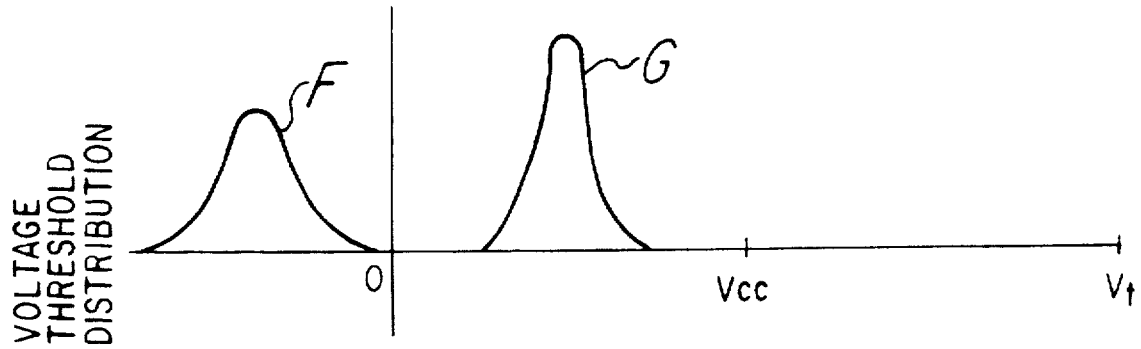
FIG. 2(c) illustrates example distributions of threshold voltages of an array of memory cells of this invention after being erased by a flash-erasing operation at relatively high-energy-level and after a flash-programming operation at relatively low energy-level

In accordance with this invention the cells 10 are prepared for individual programming by subjecting the array to a flash-erase operation, then a flash-program operation. Column decoder 18 and wordline decoder 16, in response to signals from erase control circuit 22 cause the cells 10 to be flash-erased, then and flash-programmed. Erase control circuit 22 causes pulsed electric fields adjacent a surface of each of the floating gates of the memory cells 10 of the EEPROM array, the electric fields directed toward or away from that surface of each floating gate. Erase control circuit 22 initially causes relatively high-energy-level erasing pulsed electric fields adjacent each floating gate 13. Then erase control circuit 22 causes relatively low-energy programming pulsed electric fields adjacent each floating gate 13. The pulsed voltage applied to the control gates 14 of the cells 10 is equal to the same programming voltage Vpp used to program individual cells 10. However, erase control circuit 22 causes a bias voltage Vbb so be applied to the sources 11, or the drains 12, of the cells 10. The voltage Vbb decreases the voltage between the floating gate and the source 11/drain 12, thereby decreasing the energy-level of the pulsed flash programming electric field and, therefore, decreasing the amount of charge transferred between the floating gate 13 and the source 11/drain 12 during application of the flash-programming voltages. By properly selecting Vbb, each cell 10 will have a positive threshold voltage Vt that has the same polarity as the predetermined wordline select voltage (which may be Vcc), or read voltage and that is less than that read voltage. An example distribution of the threshold voltages Vt after the flash-erasing operation is shown as bell-shaped curve F in FIG. 2(c). An example distribution of the threshold voltages Vt after the subsequent flash-programming operation is shown bell-shaped curves G in FIG. 2(c). The actual distributions will not necessarily have that shape.

If tunnel-erase-type memory cells 10 are designed to be flash-erased, but not over-erased, using erasing voltages in the range of 10 to 15 volts as in the TABLE I above, then erasing pulses in the range of 16 to 22 volts, for example, should be used to over-erase the cells 10 in accordance with this invention, assuming that the pulse length of the voltages is the same in both cases. If the voltage of the electrical energy pulses normally used to tunnel-program individual cells 10 or the array is in the range of 15 to 20 volts, the bias voltage Vbb may be, for example, in the range of 3 to 4 volts, assuming again that the pulse length of the voltages is the same in both cases.

As is also well-known, a fraction of the electrical pulse energy applied between each control gate 14 of and each source 11 or drain 12 of cells 10 is coupled to the floating gates 13.

The relative energy levels of the erasing sequence pulses may be controlled by current-limiting circuitry, by impulse-length-timing circuitry, or by other means of controlling energy-related product of voltage, current and time. Such circuitry is well-known in the art. For example, if the pulse lengths of the electrical programming and erasing pulses remain the same during the erasing sequence, the product of the voltage and current may be controlled to decrease the pulse energies with each program/erase cycle. Similarly, if the voltage or current of the electrical programming and erasing pulses remain the same during the erasing sequence, the length of the electric pulses may be shortened to decrease the pulse energies with each program/erase cycle. In fact, the relative energy levels of the pulses may be decreased by controlling the product of pulse voltage, pulse current and pulse length to decrease the pulse energies with each flash-program/flash-erase cycle.

After the cells 10 have been erased according to this invention, individual cells 10 may be programmed. The threshold voltages Vt of the programmed cells 10 will again be distributed over a range such as that illustrated by curve B of FIG. 2(a).

While the examples shown in this description relate to cell 10 structures using Fowler-Nordheim tunneling for programming, the concept is equally valid for cell 10 structures using channel-hot-electron or similar-type programming. In fact, the concept of this invention is applicable to all known nonvolatile memory arrays having floating-gate cells 10 that are programmable and erasable using electric field pulses.

Use of the circuit and procedure of this invention is straightforward. The type of cell structure and the charging/discharging structure for the floating gate must be chosen. The insulator, oxide or other type, to isolate the surfaces of the floating gate from other conducting surfaces must be chosen. If a tunneling-type structure is used for charging and/or discharging the floating gate, then sufficient voltage must be applied across the tunnel to cause the oxide or other insulator to breakdown. The voltage across the tunnel may be a fraction of the voltage applied between the control electrode and the source/drain path. The fraction at the start of the pulse may be determined from capacitance ratios. The breakdown will occur at a point where the electric field strength is highest. The relationship between voltage applied to a control electrode and the highest electric field may sometimes be calculated or derived from a handbook, may sometimes be found in literature (e.g., textured oxide surfaces), and may sometimes be derived from test structures. If hot-carrier programming and/or erasing is used, similar procedures apply to design of the structure and circuitry. Whether using tunneling, hot-carrier, or any other method, a test-cell structure may be formed on an integrated circuit chip prior to final design of programming and erasing circuitry, the cell structure tested on that chip using probes to determine the programming and erasing voltages necessary for operation, the circuitry then designed to provide those voltages for the manufactured memory array.

For example, nine floating-gate-type memory cells 10 with tunneling windows on the source 11 side were found to have manufactured voltage thresholds ranging from 1.01 volts to 1.07 volts. The nine cells 10 were on a test substrate and, using probes, were over-erased to have the same threshold voltages Vt of −8.30 volts. The cells 10 were then programmed with the source 11 biased at 4 volts, resulting in threshold voltages Vt ranging from 0.76 volts to 1.39 volts, well below the read voltage of 3.0 volts. The cells 10 were subsequently programmed without the bias voltage, resulting in threshold voltages ranging from 3.94 volts to 5.03 volts, well above the read voltage of 3.0 volts.

As is well-known, the programming and erasing pulses may be ramped to minimize damage to the floating gate insulation.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for erasing a memory cell having at least one control terminal, a floating gate, a source terminal and a drain terminal, said memory cell programmable and erasable by applying electrical energy between said control terminal and at least one of said source and drain terminals to cause programming and erasing pulsed electric fields adjacent said floating gate, said memory cell readable using a preselected read voltage applied between said control terminal and at least one of said source terminal and said drain terminal, the method comprising:

initially applying an erasing electrical energy pulse having a first energy-level between said control terminal and said at least one of said source and drain terminals of said cell; and then applying a programing electrical energy pulse having a second energy-level between said control terminal and said at least one of said source and drain terminals of said cell;

wherein said first energy level of said erasing electrical energy pulse is sufficient to cause said cell to have a threshold voltage of opposite polarity to said preselected read voltage; and wherein said second energy level of said programming electrical energy pulse is such that said cell has a threshold voltage of the same polarity as said read voltage but that is less than said read voltage.

2. The method of claim 1, wherein said programming electrical energy pulse causes a pulsed electric field directed away from said floating gate, and wherein said erasing electrical energy pulse causes a pulsed electric field directed toward said floating gate.

3. The method of claim 1, wherein said control terminal is connected to a wordline, wherein said source terminal is connected to a source-column line, wherein said drain terminal is connected to a drain-column line, and wherein said programming and erasing electrical energy pulses are caused by pulsed programming voltages and pulsed erasing voltages applied between said wordline and at least one of said source-column line and said drain-column line.

4. The method of claim 1, wherein said control terminal is connected to a wordline, wherein said source terminal is connected to a source-column line, wherein said drain terminal is connected to a drain-column line, wherein said programming and erasing electrical energy pulses are caused by pulsed programming voltages and pulsed erasing voltages applied between said wordline and at least one of said source-column line and said drain-column line; and wherein said second energy-level of said programming electrical energy pulse is controlled by applying a bias voltage to at least one of a said source-column line or a said drain-column line.

5. The method of claim 1, wherein said control terminal is connected to a wordline, wherein said source terminal is connected to a source-column line, wherein said drain terminal is connected to a drain-column line, wherein said second and first energy-levels of said programming and erasing electrical energy pulses are caused by pulsed programming currents and pulsed erasing currents applied between said wordline and at least one of said source-column line and said drain-column line.

6. The method of claim 1, wherein said control terminal is connected to a wordline, wherein said source terminal is connected to a source-column line, wherein said drain terminal is connected to a drain-column line, wherein said second and first energy-levels of said programming and erasing electrical energy pulses are related to the length of electrical programming and erasing pulses applied between said wordline and at least one of said source-column line and said drain-column line.

7. A non-volatile memory array, comprising:

memory cells arranged in rows and columns, each said memory cell having a source-drain path between first and second terminals and having a control-gate terminal;

a source-column line connected to each said first terminal of each said memory cell in a said column;

a drain-column line connected to each said second terminal of each said memory cell in a said column;

a wordline connected to each said control-gate terminal of each said memory cell in a said row;

each said memory cell having a floating-gate conductor insulated from said source-drain path and from said control gate, said floating-gate conductor being programmable and erasable by programming and erasing electrical energy pulses applied between said control gate and at least one of said first and said second terminals;

a column decoder connected to said source-column lines and said drain-column lines and a wordline decoder connected to said wordlines for providing said programming and erasing electrical energy pulses to said memory cells via said wordlines and at least one of said source-column lines and said drain-column lines; and an erase control circuit for causing said column decoder and said wordline decoder to provide said programming and erasing electrical energy pulses to said memory cells via said wordlines and at least one of said source-column lines and said drain-column lines, said control circuit causing said erasing electrical energy pulses having a sufficiently high energy-level to cause *at least one of* said floating gates initially to be over-erased, said control circuit subsequently causing said column decoder and said wordline decoder to provide said programming electrical energy pulses to [said cells] *cell having said at least one of said floating gates* via said wordlines and at least one of said source-column lines and said drain-column lines, *such that*

*said cell has a positive threshold voltage less than a predetermined positive wordline select voltage.*

8. The array of claim 7, wherein said energy-level of said programming and erasing electrical energy pulses is controlled by varying voltages applied to said wordlines and at least one of said source-column lines and said drain-column lines.

9. The array of claim 7, wherein said column decoder also provides a predetermined bias voltage to at least one of said source-column lines and drain-column lines, wherein said erase control circuit also causes said bias voltage to be applied to at least one of said source-column lines and said drain-column lines, and wherein said predetermined bias voltage has a value that causes said cells to have positive threshold voltages less than a predetermined positive wordline select voltage.

10. The array of claim 7, wherein said energy-level of said programming and erasing electrical energy pulses is controlled by varying currents applied to said wordlines and at least one of said source-column lines and said drain-column lines.

11. The array of claim 7, wherein said energy-level of said programming and erasing electrical energy pulses is controlled by varying the length of electrical pulses applied to said wordlines and at least one of said source-column lines and said drain-column lines.

12. A method of erasing a memory-cell array prior to programming said array, each said memory cell including a floating gate, *each said memory cell characterized by a positive read voltage,* the method comprising:

initially applying erasing electrical energy pulses to said cells of said memory cell array, said erasing electrical energy pulses having a energy-level sufficient to cause [each] *at least one said* memory cell of said array to have a negative threshold voltage;

then applying programming electrical energy pulses to said cells of said memory cell array, said programming electrical energy pulses having an energy-level sufficient to cause [each] *said at least one* cell of said array to have a positive threshold voltage *less than said read voltage of said array.*

13. The method of claim 12, wherein said array includes a plurality of wordlines, source-column lines and drain-column lines; wherein each said memory cell has a terminal connected to a said wordline, has a terminal connected to a said source-column line, and has a terminal connected to a said drain-column line; wherein pulsed programming and erasing voltages are applied between said wordlines of said memory array and at least one of said source-column lines and said drain-column lines of said memory array electrical energy pulses.

14. The method of claim 12, wherein said array includes a plurality of wordlines, source-column lines and drain-column lines; wherein each said memory cell has a terminal connected to a said wordline, has a terminal connected to a said source-column line, and has a terminal connected to a said drain-column line; wherein pulsed programming and erasing currents are applied between said wordlines of said memory array and at least one of said source-column lines and said drain-column lines of said memory array to form said pulsed programming and erasing electrical energy pulses.

15. The method of claim 12, wherein said array includes a plurality of word lines, source-column lines and drain-column lines; wherein each said memory cell has a terminal connected to a said wordline, has a terminal connected to a said source-column line, and has a terminal connected to a said drain-column line; wherein variable-length programming and erasing electric pulses are applied between said wordlines of said memory array and at least one of said source-column lines and said drain-column lines of said memory array; and wherein said energy-level of said programming and erasing electrical energy pulses is related to the length of said variable-length programming and erasing electric pulses.

16. The method of claim 12, wherein said erasing electrical energy pulses cause pulsed electric fields directed toward said floating gates and wherein said programming electrical energy pulses cause pulsed electric fields directed away from said floating gates.

*17. A method for erasing a memory cell having at least one control terminal, a floating gate, a source terminal and a drain terminal, said memory cell programmable and erasable by applying electrical energy between said control terminal and at least one of said source and drain terminals to cause programming and erasing pulsed electric fields adjacent said floating gate, said memory cell readable using a preselected read voltage applied between said control terminal and at least one of said source terminal and said drain terminal, the method comprising:*

*initially applying an erasing electrical energy pulse having a first energy-level between said control terminal and said at least one of said source and drain terminals of said cell; and*

*then applying a programming electrical energy pulse having a second energy-level between said control terminal and said at least one of said source and drain terminals of said cell;*

*wherein said first energy level of said erasing electrical energy pulse is sufficient to cause said cell to have a threshold voltage less than a first voltage; and*

*wherein said second energy level of said programming electrical energy pulse is such that said cell has a threshold voltage greater than said first voltage and less than said read voltage.*

*18. The method of claim 17, wherein said first voltage is zero volts.*

*19. A method for erasing a memory cell having at least one control terminal, a floating gate, a source terminal and a drain terminal, said memory cell programmable and erasable by applying electrical energy between said control terminal and at least one of said source and drain terminals to cause programming and erasing pulsed electric fields adjacent said floating gate, said memory cell readable using a preselected read voltage applied between said control terminal and at least one of said source terminal and said drain terminal, the method comprising:*

*initially applying an erasing electrical energy pulse having a first energy-level between said control terminal and said at least one of said source and drain terminals of said cell; and*

*then applying a programming electrical energy pulse having a second energy-level between said control terminal and said at least one of said source and drain terminals of said cell;*

*wherein said first energy level of said erasing electrical energy pulse is sufficient to cause said cell to have a threshold voltage representing a more energetically erased condition than that of a first voltage, said first voltage representing an erased condition relative to the read voltage; and*

*wherein said second energy level of said programming electrical energy pulse is such that said cell has a threshold voltage between said first voltage and said read voltage.*

*20. The method of claim 19, wherein said first voltage is zero volts.*

*21. A method of erasing a floating-gate memory cell having a preselected read voltage, comprising the steps of:*

*erasing the memory cell such that the cell has an initial threshold voltage less than a first voltage; and*

*programming the memory cell such that the cell has a final threshold voltage greater than the first voltage and less than the preselected read voltage.*

*22. The method of claim 21, wherein the first voltage is zero volts.*

*23. A method of erasing a floating-gate memory cell having a preselected read voltage, comprising the steps of:*

*erasing the memory cell such that the cell has an initial threshold voltage representing a more energetically erased condition than that of a first voltage, said first voltage representing an erased condition relative to the read voltage; and*

*programming the memory cell such that the cell has a final threshold voltage between the first voltage and the preselected read voltage.*

*24. The method of claim 23, wherein the first voltage is zero volts.*

*25. A memory device readable using a preselected read voltage, comprising:*

*a source;*

*a drain separated from said source by a source-drain path;*

*a control gate insulated from said source-drain path;*

*a floating gate insulated from said source-drain path and said control gate;*

*a column decoder coupled to said source and drain to apply programming and erasing voltages;*

*a wordline decoder coupled to said control gate to apply programming and erasing voltages to said control gate; and*

*an erase control circuit coupled to said column decoder and wordline decoder, said control circuit controlling said column decoder and wordline decoder initially to generate erasing voltages sufficient to result in an initial threshold voltage less than a first voltage, and subsequently to generate programming voltages sufficient to result in a final threshold voltage less than the read voltage.*

*26. The memory device of claim 25, wherein said final threshold voltage resulting from said programming voltages is greater than said first voltage.*

*27. The memory device of claim 26, wherein said first voltage is zero volts.*

*28. A memory device readable using a preselected read voltage, comprising:*

*a source;*

*a drain separated from said source by a source-drain path;*

*a control gate insulated from said source-drain path;*

*a floating gate insulated from said source-drain path and said control gate, said floating-gate being programmable and erasable by programming and erasing electrical energy pulses applied between said control gate and at least one of said source and drain;*

*a column decoder connected to said source and drain and a wordline decoder connected to said control gate to provide said programming and erasing electrical energy pulses; and*

*an erase control circuit operable to cause said column decoder and said wordline decoder to provide said programming and erasing electrical energy pulses, said control circuit causing said erasing electrical energy pulses to have a sufficiently high energy-level to result in an initial threshold voltage less than a first voltage, said control circuit subsequently causing said column decoder and said wordline decoder to provide said programming electrical energy pulses sufficient to result in a final threshold voltage less than the read voltage.*

*29. The memory device of claim 28, wherein said final threshold voltage resulting from said programming electrical energy pulses is greater than said first voltage.*

*30. The memory device of claim 29, wherein said first voltage is zero volts.*

*31. A memory device readable using a preselected read voltage, comprising:*

*a source;*

*a drain separated from said source by a source-drain path;*

*a control gate insulated from said source-drain path;*

*a floating gate insulated from said source-drain path and said control gate;*

*a first decoder coupled to said source and drain to apply programming and erasing voltages;*

*a second decoder coupled to said control gate to apply programming and erasing voltages to said control gate; and*

*an erase control circuit coupled to said column decoder and wordline decoder, said control circuit controlling said column decoder and wordline decoder initially to generate erasing voltages sufficient to result in an initial threshold voltage less than a first voltage, and subsequently to generate programming voltages sufficient to result in a final threshold voltage greater than said first voltage and less than the read voltage.*

*32. The memory device of claim 31, wherein said first voltage is zero volts.*

* * * * *